United States Patent [19]

Okinoshima et al.

[11] Patent Number: 5,441,845

[45] Date of Patent: Aug. 15, 1995

[54] PHOTOSENSITIVE RESIN COMPOSITION COMPRISING A POLYIMIDE PRECURSOR AND A PHOTOSENSITIVE DIAZOQUINONE

[75] Inventors: Hiroshige Okinoshima, Annaka; Hideto Kato, Takasaki, both of Japan

[73] Assignee: Shin-Etsu Chemical Co., Ltd., Tokyo, Japan

[21] Appl. No.: 197,519

[22] Filed: Feb. 16, 1994

[30] Foreign Application Priority Data

Feb. 17, 1993 [JP] Japan ................................ 5-051418

[51] Int. Cl.⁶ ............................................. G03F 7/023
[52] U.S. Cl. .................................. 430/191; 430/192; 430/193
[58] Field of Search ........................ 430/191, 192, 193

[56] References Cited

U.S. PATENT DOCUMENTS

| | | |
|---|---|---|
| 3,623,870 | 11/1971 | Curran et al. |
| 3,957,512 | 5/1976 | Kleeberg et al. |
| 4,243,743 | 1/1981 | Hiramoto et al. ............... 430/281 |
| 4,515,887 | 5/1985 | Davis ............................ 430/283 |
| 4,587,204 | 5/1986 | Davis ............................ 430/325 |
| 5,104,768 | 4/1992 | Sassmmannshausen et al. ... 430/192 |
| 5,288,588 | 2/1994 | Yukawa et al. ................. 430/192 |

FOREIGN PATENT DOCUMENTS

| | | |
|---|---|---|
| 43-18790 | 8/1968 | Japan. |
| 55-45746 | 3/1980 | Japan. |
| 62-275129 | 11/1987 | Japan. |

OTHER PUBLICATIONS

"New High Temperature Stable Positive Photoresists Based On Hydroxy Polyimides And Polyamides Containing The Hexafluoroisopropylidene (6–F) Linking Group" By D. N. Khanna et al; Polymer Engineering and Science, Jul. 1989, vol. 29, No. 14, pp., 954–959.

Primary Examiner—Charles L. Bowers, Jr.
Assistant Examiner—Christopher G. Young
Attorney, Agent, or Firm—Lowe, Price, Leblanc & Becker

[57] ABSTRACT

A photosensitive resin composition which is adapted for protecting articles and particularly, electronic parts, therewith comprises a polyimide precursor of the following general formula

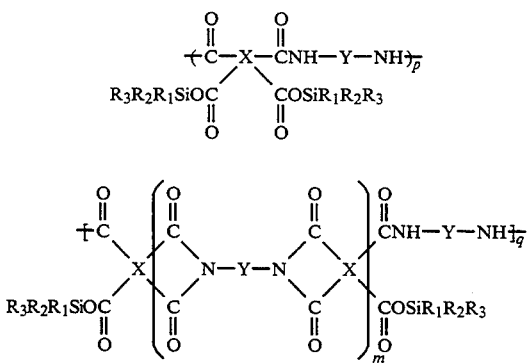

wherein each X individually represents a tetravalent organic group, each Y individually represents a divalent organic group, $R^1$, $R^2$ and $R^3$ may be the same or different and represent a hydrogen atom or a monovalent organic group having form 1 to 10 carbon atoms, and p, q and m are, respectively, an integer of 1 or over, and a photosensitive diazoquinone compound.

9 Claims, No Drawings

PHOTOSENSITIVE RESIN COMPOSITION COMPRISING A POLYIMIDE PRECURSOR AND A PHOTOSENSITIVE DIAZOQUINONE

BACKGROUND OF THE INVENTION

1. Field of The Invention

This invention relates to a photosensitive resin composition which has wide utility in the fields of protective insulating films for semiconductor devices, alignment films for liquid crystal display devices and insulating films for multi-layered printed boards. The invention also relates to heat-resistant cured products obtained from the composition, particularly heat-resistant cured films for protecting heat-resistant electronic parts.

2. Description of the Prior Art

A number of heat-resistant photosensitive materials have been heretofore proposed including, for example, materials comprising polyamic acids and bichromates (U.S. Pat. No. 3,623,870), materials which comprise polyamic acids whose carboxyl groups are introduced with photosensitive groups through ester bonds (U.S. Pat. No. 3,957,512 and Japanese Laid-open Patent Application No. 55-45746), and materials comprising polyamic acids whose carboxyl groups are introduced with photosensitive groups through amido bonds (U.S. Pat. Nos. 4,515,887 and 4,587,204). Further, there have been proposed materials which comprise polyamic acids whose carboxyl groups are introduced with photosensitive groups through silyl ester bonds (Japanese Laid-open Patent Application No. 62-275129) and materials which comprise polyamic acids and amine compounds having photosensitive groups (U.S. Pat. No. 4,243,743).

However, these materials still have problems in the incorporation of ionic impurities for the materials of U.S. Pat. Nos. 3,623,870 and 3,957,512, in swelling at the time of development for the materials of U.S. Pat. Nos. 3,957,512, 4,515,887 and 4,587,204 and Japanese Laid-open patent application No. 55-45746, and in the sensitive stability for the materials of Japanese Laid-open Patent Application Nos. 62-275129 and U.S. Pat. No. 4,243,743.

In order to solve the above problems, there has been proposed a positive photosensitive resin composition which comprises polyimide resins having a phenolic group and naphthoquinone diazidosulfonate (Polymer Engineering And Science, July 1989, Vol. 29, 954). However, this photosensitive resin composition has to make use of a specific type of polyimide, coupled with another problem that the phenolic groups are liable to remain after formation of the film. The phenolic groups left in the film will cause the resin to have an increasing water absorption. This is not favorable when such a composition is applied to electronic parts. Alternatively, U.S. Pat. No. 5,104,768 sets out a photosensitive resin composition which comprises esterified polyamic acids and photosensitive quinonediazides. This composition essentially requires an alkaline aqueous solution of a high concentration for development. In addition, it undesirably takes a long time for the development. Thus, the composition is not suitable for practical applications.

SUMMARY OF THE INVENTION

It is accordingly an object of the invention to provide a positive photosensitive polyimide resin composition wherein a wide variety of polyimide resins are usable without resorting to any specific type of polyimide resin and wherein ionic impurities are not incorporated at the time of the preparation of the composition.

It is another object of the invention to provide a positive photosensitive polyimide resin composition which exhibits good photosensitivity without involving any appreciable degree of shrinkage after curing and which is substantially free of swelling of the cured film obtained therefrom at the time of development.

It is a further object of the invention to provide a positive photosensitive polyimide resin composition capable of yielding a cured film which is resistant to heat.

It is a still further object of the invention to provide a cured protective film obtained from the composition, which film is adapted for protecting electronic parts therewith.

The above objects can be achieved, according to one embodiment of the invention, by a photosensitive resin composition which comprises:

100 parts by weight of a polyimide precursor of the following general formula (1)

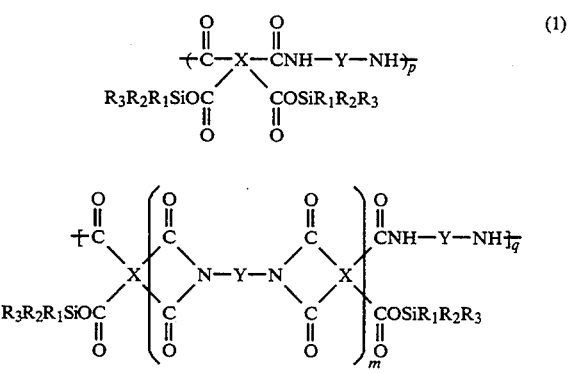

wherein each X individually represents a tetravalent organic group having an aromatic ring or an aliphatic ring, i.e. an alicyclic group, each Y individually represents a divalent organic group, $R^1$, $R^2$ and $R^3$ may be the same or different and represent a hydrogen atom or a monovalent organic group having form 1 to 10 carbon atoms, and p, q and m are, respectively, an integer of 1 or over provided that $1/20 \leq q/p \leq 9$; and from 2 to 100 parts by weight of a photosensitive diazoquinone compound.

The invention also provides a cured product obtained from the above composition. The cured product is preferably in the form of a film which is applied to electronic parts for protection. When the polyimide precursor of the above general formula (1) is mixed with a photosensitive diazoquinone, there is obtained a positive photosensitive polyimide resin precursor composition. This composition is substantially free of any ionic impurities and exhibits good sensitivity on irradiation with light., ensuring ready formation of a desired pattern. In addition, when the composition is applied in a desired pattern and cured by application of light, the film suffers little reduction in volume at the time of the curing. The cured polyimide product or film exhibits a good heat resistance and good electric and mechanical characteristics.

DETAILED DESCRIPTION AND EMBODIMENTS OF THE INVENTION

The polyimide precursor of the general formula (1) is prepared, for example, according to the process set out in Japanese Patent Publication No. 43-18790.

More particularly, a tetracarboxylic acid dianhydride of the following general formula (2), a polyimide oligomer terminated with an acid anhydride at both ends thereof and represented by the following general formula (3) and a silylated diamine of the following general formula (4) are reacted in an appropriate solvent to readily obtain the polyimide precursor

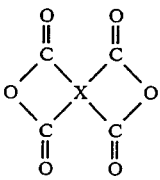 (2)

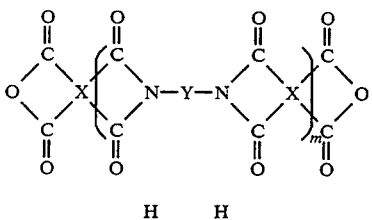 (3)

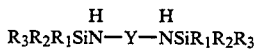 (4)
$R_3R_2R_1SiN—Y—NSiR_1R_2R_3$

In the above formulas, X, Y and $R^1$ to $R^3$ and m have, respectively, the same meanings as defined with respect to the formula (1). In the reaction, the tetracarboxylic dianhydride and the polyimide oligomers terminated with an anhydride at ends thereof are used, in total, substantially in an equimolar amount to the silylated diamine. The reaction conditions include a temperature of from 0° to 50° C. for 2 to 24 hours.

In the general formula (1), X represents a tetravalent organic group containing an aromatic ting or a aliphatic ring. The organic group is derived from the starting tetracarboxylic dianhydride of the formula (2). Typical examples of the group represented by X include those groups of the following formulas

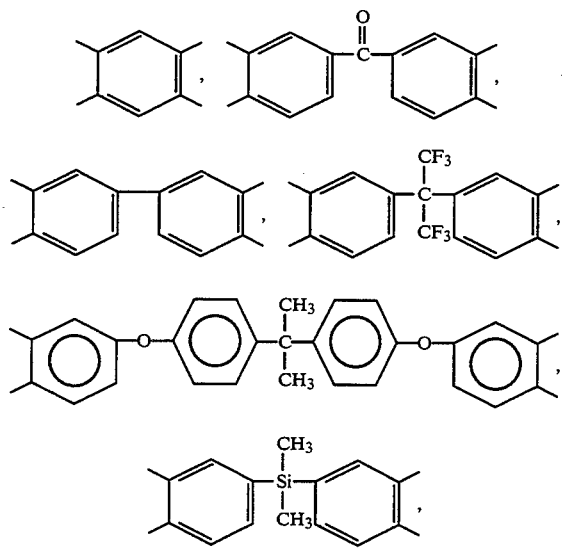

-continued

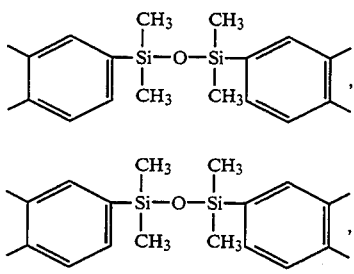

Typical examples of the tetracarboxylic dianhydride of the formula (2) include those compounds corresponding to the above-indicated tetravalent organic groups X such as pyromellitic dianhydride, benzophenonetetracarboxylic dianhydride, 3,3',4,4'-biphenyltetracarboxylic dianhydride, 2,2-bis[4-(3,4-dicarboxyphenoxy)phenyl)propane dianhydride, 2,2-bis(3,4-benzenedicarboxylic anhydride)perfluoropropane, bis(3,4-dicarboxyphenyl)dimethylsilane dianhydride, 1,3-bis(3,4-dicarboxyphenyl)-1,1,3,3-tetramethyldisiloxane dianhydride, 1,3-bis[4-(1,2,3,6-tetrahydroanhydrous phthalic acid)]-1,1,3,3-tetramethyldisiloxane, and the like. These compounds may be used singly or in combination.

The divalent organic group represented by Y in the formula (1) is derived from the starting material of the general formula (3). Suitable examples of the diamine include, although not limitative, aromatic ring-containing diamines such as p-phenylenediamine, m-phenylenediamine, 4,4'-diaminodiphenylmethane, 4,4'-diaminodiphenyl ether, 2,2'-bis(4-aminophenyl)propane, 4,4'-diaminodiphenylsulfone, 4,4-diaminodiphenylsulfide, 1,4-bis(3-aminophenoxy)benzene, 1,4-bis(4-aminophenoxy)benzene, 1,4-bis(p-aminophenylsulfonyl)benzene, 1,4-bis(m-aminophenylsulfonyl)benzene, 1,4-bis(p-aminophenylthioether)benzene, 1,4-bis(m-aminophenylthioether)benzene, 2,2-bis[4-(4aminophenoxy)phenyl]propane, 2,2-bis[3-methyl-4-(4-aminophenoxy)phenyl]propane, 2,2-bis[3-chloro-4-(4-aminophenoxy)phenyl]propane, 1,1-bis[4-(4-aminophenoxy)phenyl]ethane, 1,1-bis[ 3-methyl-4-(4-aminophenoxy)phenyl]ethane, 1,1-bis[3-chloro-4-(4-aminophenoxy)phenyl]ethane, 1,1-bis[3,5-dimethyl-4-(4-aminophenoxy)phenyl]ethane, bis[4-(4-aminophenoxy)phenyl]methane, bis[3-methyl-4-(4-aminophenoxy)phenyl]methane, bis[3-chloro-4-(4aminophenoxy)phenyl]methane, bis[3,5-dimethyl-4-(4-aminophenoxy)phenyl]methane, bis[4-(4-aminophenoxy)phenyl]sulfone, 2,2-bis[4-(4-aminophenoxy)phenyl]perfluoropropane and the like, and diamines having an amido nuclear substituent (or substituents) and silicon diamines of the following formulas

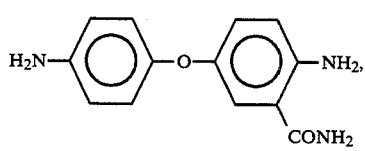

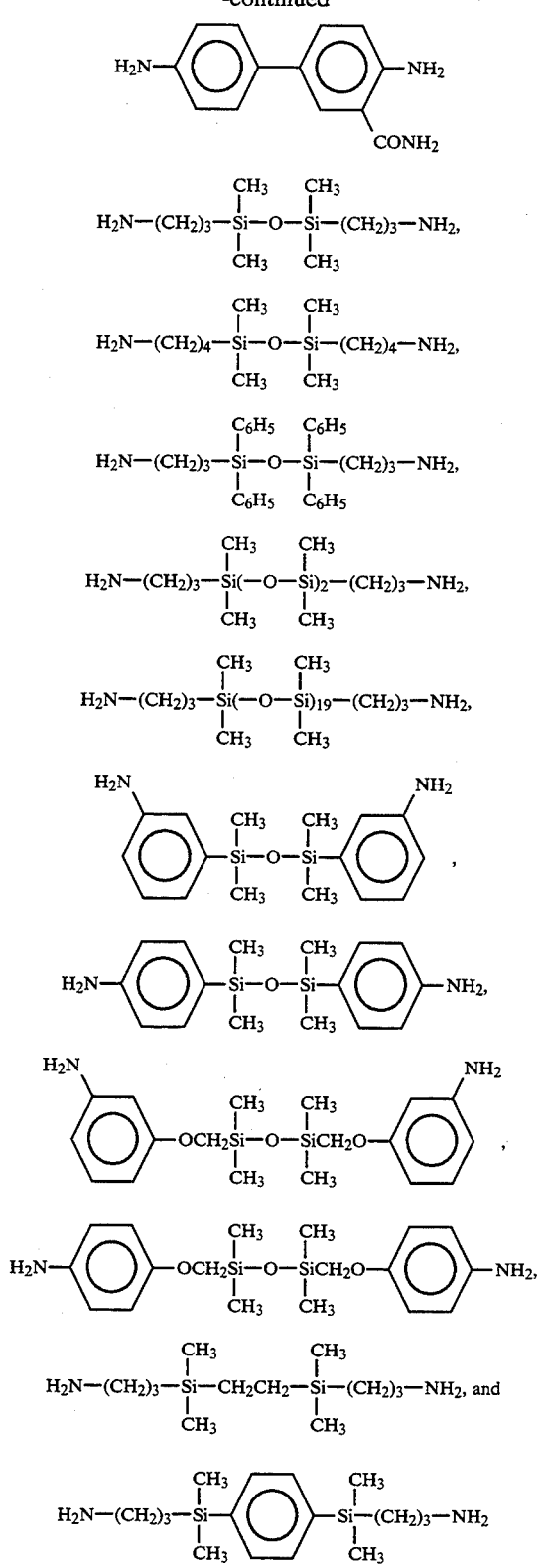

alkyl group such as a methyl group, an ethyl group, a propyl group, a butyl group and the like, an alkenyl group such as a vinyl group, an allyl group, a butenyl group and the like, an aryl group such as a phenyl group, a tolyl group and the like, and those groups indicated above but part or all of the hydrogen groups thereof being substituted a halogen atom, a cyano group or an alkoxy group. Examples of the substituted organic group include a chloromethyl group, a chloropropyl group, a 3,3,3-trifluoropropyl group, a 2-cyanoethyl group, a methoxy group, an ethoxyethyl group and the like. Of these, the organic groups having from 1 to 6 carbon atoms are preferred.

In the formula (1), suitable examples of the silyl group having the groups of $R^1$, $R^2$ and $R^3$ (i.e. $R^1R^2R^3Si$ group) include those groups of the following formulas, although not limitative, —SiH(Me)$_2$, —Si(Me)$_3$, —Si(-Me)$_2$.Et, Si(Me)$_2$.Vi, —Si(Et)$_3$, —Si(Me).iso-Pr, —Si(-Me)$_2$.tert-Bu, —Si(Me)$_2$–.Ph, and the like, wherein Me represents a methyl group, Et represents an ethyl group, Pr represents a propyl group, Bu represents a butyl group, Vi represents a vinyl group, and Ph represents a phenyl group.

In the formula (1), p, q and m are, respectively, an integer of 1 or over provided that $1/20 \leq q/p \leq 9$. In order to impart good photosensitive characteristics and storage stability to the composition and to ensure only a small degree of shrinkage of the composition particularly in the form of a film at the time of curing along with good physical properties, it is preferred that $1/10 \leq q/p \leq 5$, $10 \leq p+q \leq 200$ and $1 \leq m \leq 20$.

The polyimide precursor of the formula (1) is considered to have at ends thereof the terminal structure or group of the following formula

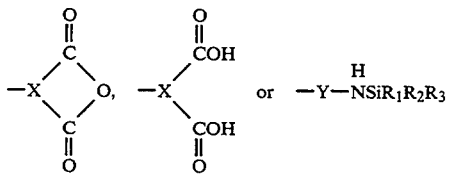

wherein X, Y and $R^1$ to $R^3$ have, respectively, the same meanings as defined hereinbefore.

In the practice of the invention, a photosensitive diazoquinone compound is used in combination with the polyimide precursor. Examples of such diazoquinone compounds include o-naphthoquinone diazidosulfonates, o-naphthoquinone diazidosulfoneamides and the like. Of these, an o-naphthoquinone diazidosulfonate of the following general formula (5) is preferred

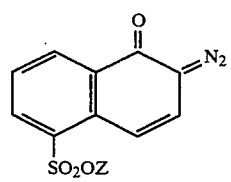

wherein Z represents a monovalent organic group containing at least one aromatic ring. Although not limited to those indicated hereinbelow, specific examples of the o-naphthoquinone diazidosulfonates include the following compounds (a) to (g).

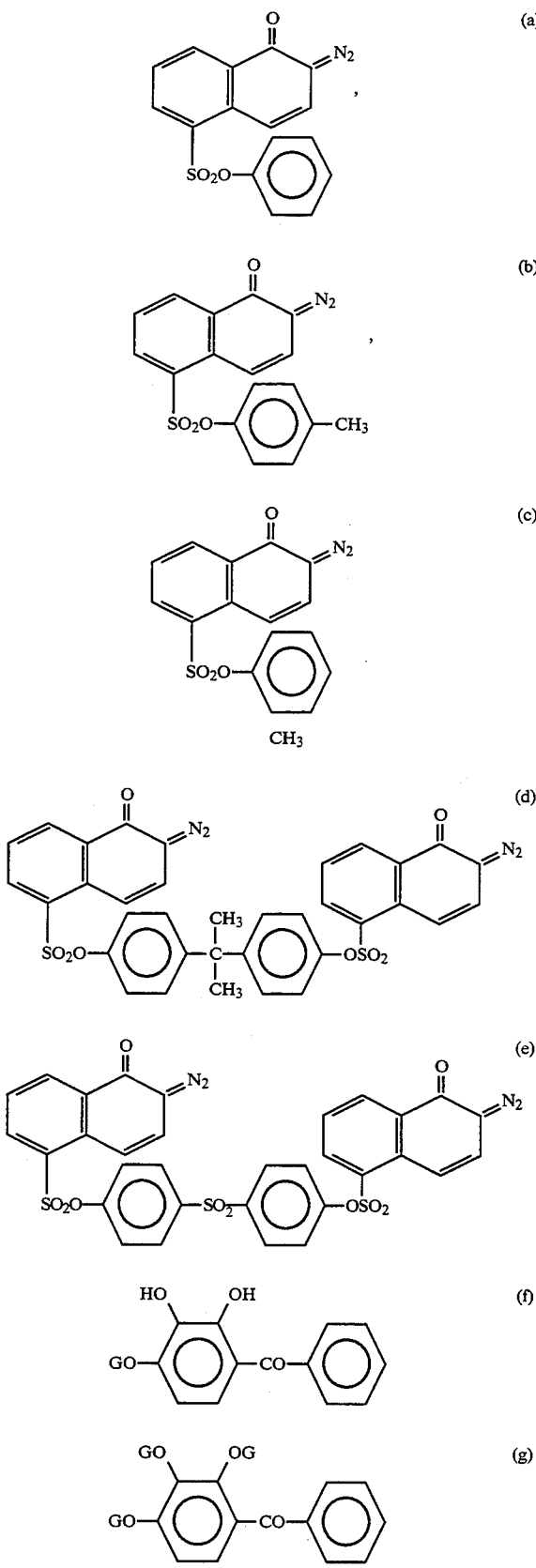

In the formulas (f) and (g), each G individually represents

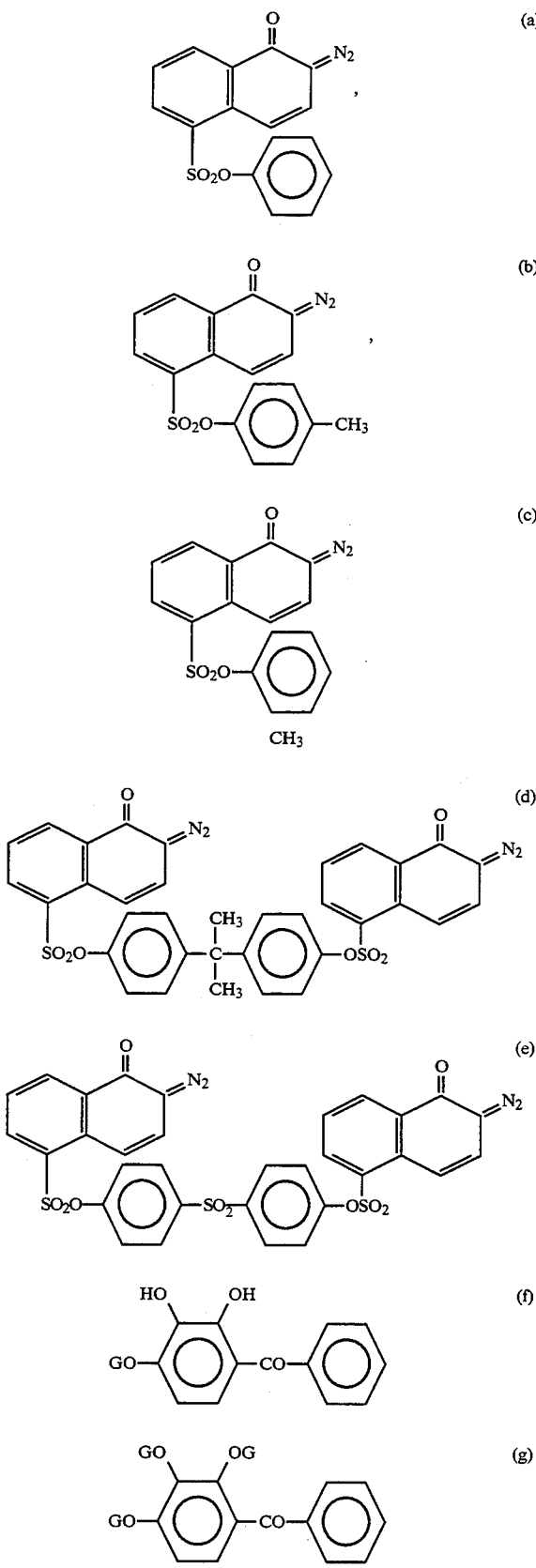

These o-naphthoquinone diazidosulfonates may be used singly or in combination.

The photosensitive composition of the invention is readily obtained by mixing the polyimide precursor of the general formula (1) and the photosensitive diazoquinone compound. The mixing ratio between the precursor and the diazoquinone compound is generally in the range of 2 to 100 parts by weight of the diazoquinone compound per 100 parts by weight of the precursor. From the standpoint of the photosensitivity and storage stability, the amount of the diazoquinone compound is preferably in the range of from 5 to 50 parts by weight per 100 parts by weight of the precursor.

The photosensitive resin composition of the invention is ordinarily applied to substrates after dissolution in appropriate solvents. Such solvents may be ones which are employed for the preparation of the polyimide precursor. Although having not set out with reference to the preparation of the precursor, specific examples of the solvent include N-methyl-2-pyrrolidone, dimethylacetamide, dimethylformamide, hexamethylphosphoramide, tetrahydrofuran, 1,4-dioxin, methyl cellosolve (i.e. β-oxyethyl methyl ether), butyl cellosolve (β-oxyethyl butyl ether), diethylene glycol dimethyl ether, diethylene glycol, diethyl ether, triethylene glycol dimethyl ether, acetone, methyl ethyl ketone, methyl iso-butyl ketone, cyclopentanone, cyclohexanone, γ-butyrolactone, butyl cellosolve acetate, toluene, xylene and the like. These may be used singly or in combination. If dissolved in a solvent, the composition is diluted to a level of 10 to 40wt %.

The solution of the photosensitive resin composition in an organic solvent may be applied onto various substrates, such as silicon wafers, metallic sheets, glass sheets, ceramic substrates and the like, according to any known procedures such as spin coating, immersion, printing and the like. After completion of the application, the applied layer is heated in a dryer or by means of a hot plate and pre-baked at a temperature of from 30 to 140° C. for several minutes to several hours so that most of the solvent can be removed from the film to obtain a film of the photosensitive resin composition. Then, a mask of a desired pattern is placed on the film and irradiated with light rays such as visible light, UV light and the like for several seconds to several minutes. When the thus irradiated film is developed with a developer to remove the portions where exposed, thereby obtaining a relief pattern. The developer used for this purpose is preferably a tetramethylammonium hydroxide aqueous solution.

The relief pattern formed by the development is made of the polyimide precursor. When the relief pattern is heated at a temperature of from 200° to 500° C., preferably from 300 to 400° C., for several tens minutes to several hours, there can be obtained a polyimide film pattern. The heating may be effected by use of a dryer, an electric furnace or the like.

Thus, the resin composition of the invention can be readily patterned and cured. The resultant resin film exhibits good heat resistance and good mechanical and electrical characteristics and can be appropriately used as a protective film for electronic parts.

The cured resin film of the invention has wide utility in the fields of, for example, junction coat films, passivation films and buffer coat films on the surface of semiconductors such as diodes, transistors, integrated circuits, large-scale integrated circuits and the like, α-ray shielding films for large-scale integrated circuits, layer insulating films for multi-layered electrodes, conformal coatings such as of printed circuit boards, alignment film for liquid The present invention is more particularly described by way of examples.

Reference 1

35.5 g (0.08 moles) of 2,2-bis(3,4-benzenedicarboxylic an-hydride)perfluoropropane and 300 g of N-methyl-2-pyrrolidone used as a solvent were charged into a flask equipped with an agitator, a thermometer and a nitrogen-purge device, into which 80 g of a solution of 12.0 g (0.06 moles) of diaminodiphenyl ether in N-methyl-2-pyrrolidone was gradually dropped. After completion of the dropping, the solution was further agitated at room temperature for 10 hours. The flask was attached with a reflux condenser equipped with a water receiver, followed by addition of 30 g of xylene and heating the reaction system to a temperature of 160° C. at which the system was maintained over 6 hours. By the reaction, 2 g of water was produced.

The yellowish brown reaction solution obtained by the above procedure was cooled and then charged into methanol for precipitation,, followed by drying to obtain 41.5 g of a polyimide compound (a-1) having the following structural formula

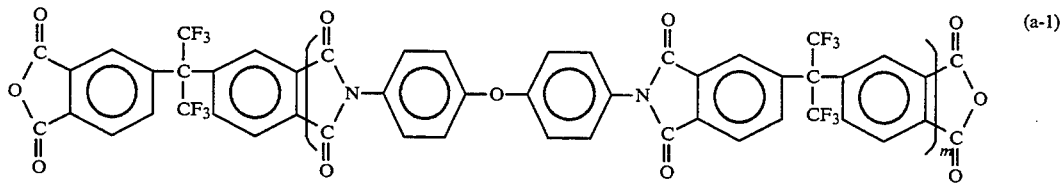

wherein m=3.

Reference 2

The general procedure of Reference 1 was repeated using 42.6 g (0.10 mole) of 1,3-bis(3,4-dicarboxyphenyl)-1,1,3,3-tetramethyldisiloxane dianhydride, 17.8 g (0.09 moles) of 4,4'-methylenedianiline, and 400 g of diethylene glycol dimethyl ether used as a solvent, thereby obtaining 54.2 g of a polyimide compound (a-2) having the following structural formula

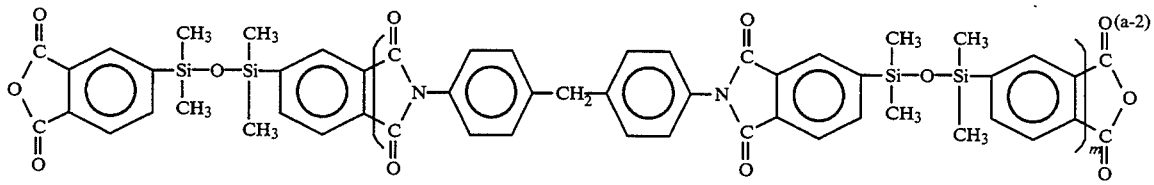

wherein m=9.

Reference 3

26.7 g (0.06 moles) of 2,2-bis(3,4-benzenedicarboxylic acid anhydride)perfiuoropropane used as an acid arthydride, 23.7 g of the polyimide compound obtained in Reference 1, 24.1 g (0.07 moles) of N,N'-bis(trimethylsilyl)-4,4'-diaminodiphenyl ether used as a silylated diamine, and 220 g of γ-butyrolactone (solvent) were charged into a flask equipped with an agitator, a thermometer and a nitrogen-purging device, followed by reaction at room temperature for 10 hours, thereby obtaining a solution of a polyimide precursor (A1) of the following structural formula having a viscosity of 4,000 cps., at 25° C.

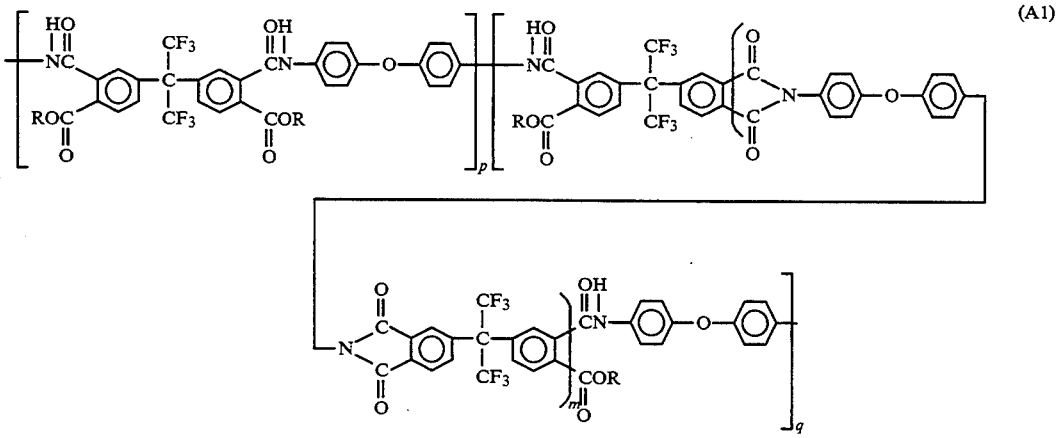

wherein R=Si(CH$_3$)$_3$,, m=3, q/p=1/6.

Reference 4

In the same manner as in Reference 3, 16.1 g (0.05 moles) of 3,3',4,4'-benzphenonetetracarboxylic dianhydride used as the acid anhydride, 30.1 g of the polyimide compound (a-2) obtained in Reference 2, 12.0 g (0.035 moles) of N,N'-bis(trimethylsilyl)-4,4-diaminodiphenyl ether and 8.6 g (0.02 moles) of N,N'-bis(t-butyldimethylsilyl)-4,4'-diaminodiphenyl ether, both used as a silylated diamine, and 200 g of N-methyl-2-pyrrolidone (solvent) were used for the reaction, thereby obtaining a solution of a polyimide precursor resin (A2) having the following structural formula

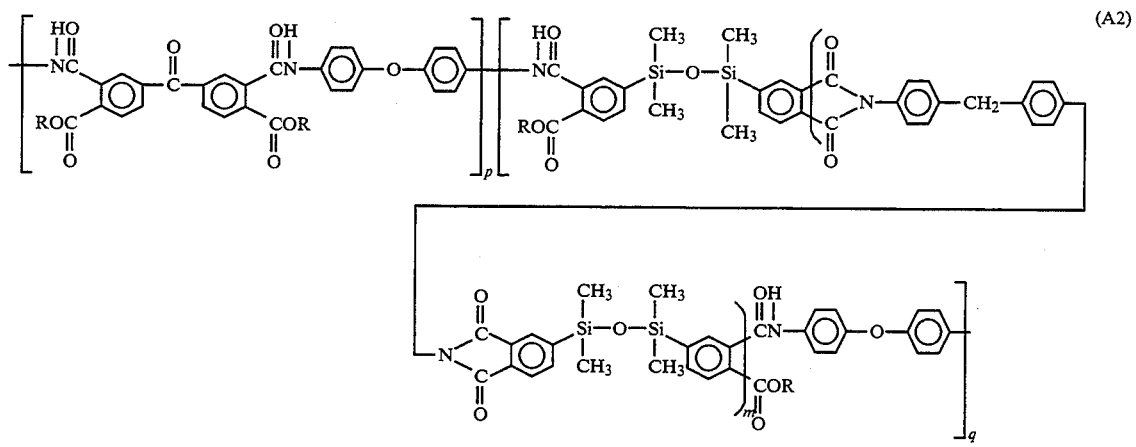

wherein $R = -Si(CH_3)_3 / -Si(CH_3)_2 = 35/20$,
            |
         $C(CH_3)_3$ $m=9$ and $q/p=1/10$.

spectively, according to the formulations indicated in Table 1, thereby preparing compositions of Examples 1 to 5.

Each composition was applied onto a silicon wafer by means of a spin coater and dried in a dryer under conditions of a temperature of 80° C. and a time of 0.5 hours. The resultant film was brought into intimate contact with a photomask having a striped pattern, followed by irradiation with a UV ray from a super high pressure mercury lamp of 250 W for 20 seconds. The thus irradiated film was developed with a 2.4% tetramethylammonium aqueous solution and rinsed with pure water. The resultant line and space pattern was observed and a minimum line width was measured. Moreover, the developed film was cured in a dryer under conditions of 150° C./1 hour and then 350° C./0.5 hours and the ratio between the thicknesses of the cured film after and before the curing (i.e. a ratio=the film thickness after the curing/the film thickness before the curing) was determined. The results are shown in Table 1 below.

TABLE 1

| Example | Composition (Amount (parts by weight)) | | | Photosensitive Properties | | Ratio Between Film Thicknesses After and Before Curing | Film Thickness After Curing ($\mu m$) |
| | Resin | Diazoquinone* | Solvent | Pattern Form | Resolution ($\mu m$) | | |
| --- | --- | --- | --- | --- | --- | --- | --- |
| 1 | A 1 (15) | (c) (4) | γ-butyrolactone (81) | good | 5 | 0.64 | 2.1 |
| 2 | A 1 (15) | (d) (4) | γ-butyrolactone (81) | good | 4 | 0.65 | 2.3 |
| 3 | A 1 (15) | (g) (4) | γ-butyrolactone (81) | good | 4 | 0.65 | 2.3 |
| 4 | A2 (15) | (d) (3) | N-methyl-2-pyrrolidone (82) | good | 5 | 0.67 | 2.5 |
| 5 | A2 (15) | (g) (3) | N-methyl-2-pyrrolidone (82) | good | 5 | 0.68 | 2.6 |

*The alphabetic marks indicate diazoquinones corresponding to those indicated hereinbefore.

EXAMPLES 1 to 5

Photosensitive diazoquinones and the solvents used in the resin solutions obtained in References 3 and 4 were added to the resin solutions of References 3 and 4, re- As will be apparent from the results of the above table, the resin compositions of the invention exhibit good photosensitive properties. In view of the fact that known photosensitive polyimide materials exhibit a ratio between the film thicknesses air and before curing of, at most, about 0.5, the ratio of the compositions of the invention is significantly higher. Thus, the compositions of the can be appropriately used as a protective film for electronic parts.

What is claimed is:

1. A photosensitive resin composition which comprises in admixture:

100 parts by weight of a polyimide precursor of the following general formula (1)

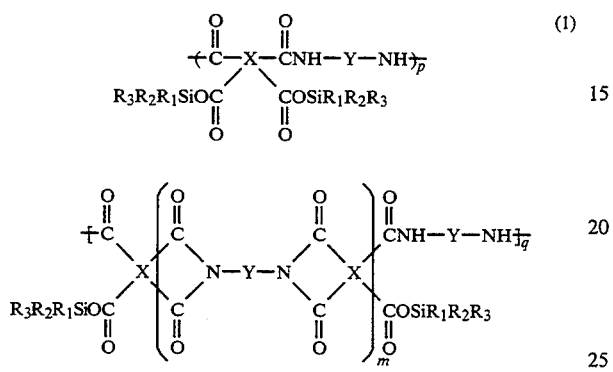

wherein each X individually represents a tetravalent organic group having an aromatic ring or an aliphatic ring, i.e. an alicyclic group, each Y individually represents a divalent organic group, $R^1$, $R^2$ and $R^3$ may be the same or different and represents a hydrogen atom or a monovalent organic group having form 1 to 10 carbon atoms, and p, q and m are, respectively, an integer of 1 or over provided that $1/20 \leq q/p \leq 9$; and from 2 to 100 parts by weight of a photosensitive diazoquinone compound.

2. A photosensitive resin composition According to claim 1, wherein $R^1$, $R^2$ and $R^3$ individually represent a hydrogen atom.

3. A photosensitive resin composition according to claim 1, wherein $R^1$, $R^2$ and $R^3$ individually represent a monovalent organic group having from 1 to 6 carbon atoms.

4. A photosensitive resin composition according to claim 1, wherein $1/10 \leq q/p \leq 5$, $10 \leq p+q \leq 200$, and $1 \leq m \leq 20$.

5. A photosensitive resin composition according to claim 1, wherein said photosensitive diazoquinone compound is a member selected from the group consisting of o-naphthoquinonediazidosulfonates and o-naphthoquinonediazidosulfoneamides.

6. A photosensitive resin composition according to claim 5, wherein said photosensitive diazoquinone compound consists essentially of an o-naphthoquinonediazidosulfonate of the following formula

wherein Z represents an aromatic group-bearing monovalent group.

7. A photosensitive resin composition according to claim 6, wherein said naphthoquinonediazosulfonate is a member selected from the group consisting of compounds of the following formulas (a) to (g)

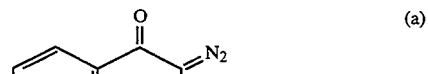

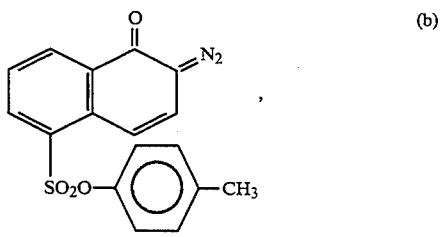

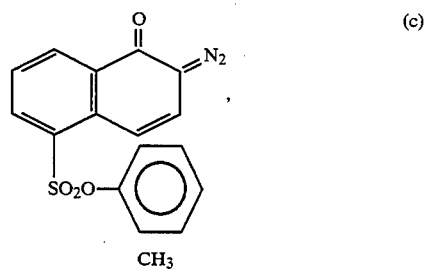

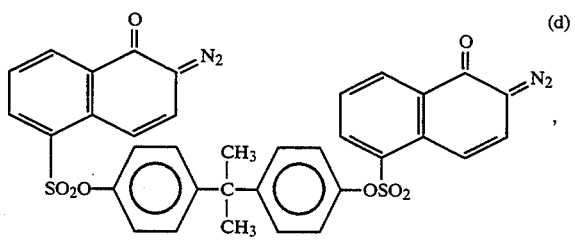

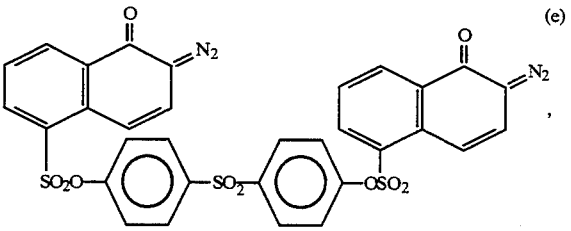

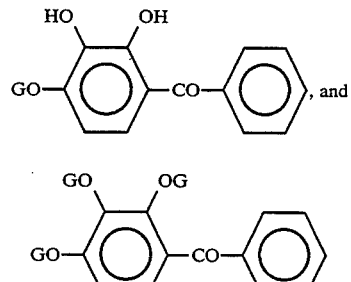

wherein G represents a group of the formula

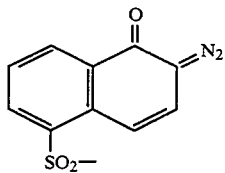

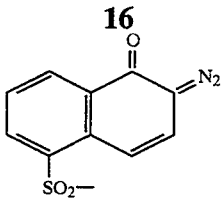

8. A photosensitive resin composition according to claim 5, wherein said photosensitive diazoquinone compound consists essentially of an o-naphthoquinonediazidosulfoneamide.

9. A photosensitive resin composition according to claim 1, wherein said composition is dissolved in a solvent to a level of 10 to 40 wt %.

* * * * *

8. A photosensitive resin composition according to claim 5, wherein said photosensitive diazoquinone compound consists essentially of an o-naphthoquinonediazidosulfoneamide.

9. A photosensitive resin composition according to claim 1, wherein said composition is dissolved in a solvent to a level of 10 to 40 wt %.

* * * * *